US012286306B2

(12) United States Patent
Hsu et al.

(10) Patent No.: US 12,286,306 B2
(45) Date of Patent: Apr. 29, 2025

(54) OVERHEAD TRANSPORT SYSTEM

(71) Applicant: Taiwan Semiconductor Manufacturing Co., Ltd., Hsinchu (TW)

(72) Inventors: Chieh Hsu, Hsinchu (TW); Guancyun Li, Hsinchu (TW); Ching-Jung Chang, Hsinchu (TW); Chi-Feng Tung, Hsinchu (TW); Hsiang-Yin Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 941 days.

(21) Appl. No.: 17/384,360

(22) Filed: Jul. 23, 2021

(65) Prior Publication Data

US 2022/0289492 A1 Sep. 15, 2022

Related U.S. Application Data

(60) Provisional application No. 63/160,517, filed on Mar. 12, 2021.

(51) Int. Cl.

| | |
|---|---|
| ***B65G 43/02*** | (2006.01) |
| ***B61B 3/00*** | (2006.01) |
| ***G01B 21/22*** | (2006.01) |
| ***G01C 9/06*** | (2006.01) |
| ***G01H 1/00*** | (2006.01) |
| ***H01L 21/677*** | (2006.01) |

(52) U.S. Cl.

CPC ................ *B65G 43/02* (2013.01); *B61B 3/00* (2013.01); *G01B 21/22* (2013.01); *G01C 9/06* (2013.01); *G01H 1/00* (2013.01); *H01L 21/67703* (2013.01); *H01L 21/6773* (2013.01); *H01L 21/67733* (2013.01); *B65G 2201/0297* (2013.01)

(58) Field of Classification Search

CPC ........... H01L 21/67733; H01L 21/6773; H01L 21/67703; B65G 43/02; B65G 2201/0297; G01B 21/22; G01C 9/06; G01H 1/00

See application file for complete search history.

(56) References Cited

U.S. PATENT DOCUMENTS

| | | | | |
|---|---|---|---|---|
| 6,519,502 | B2 * | 2/2003 | Chao | H01L 21/67781 414/940 |
| 8,712,600 | B2 * | 4/2014 | Hayashi | G05D 1/0212 701/2 |
| 9,758,310 | B2 * | 9/2017 | Murao | H01L 21/67736 |
| 10,564,632 | B2 * | 2/2020 | Hsu | H01L 21/67727 |
| 11,107,713 | B2 * | 8/2021 | Li | H01L 21/67242 |

(Continued)

*Primary Examiner* — Zachary L Kuhfuss

*Assistant Examiner* — Cheng Lin

(74) *Attorney, Agent, or Firm* — Seed IP Law Group

(57) ABSTRACT

An overhead transport system is provided capable of absorbing abnormal vibration and determining a source of the abnormal vibration. The overhead transport system in accordance with various embodiments of the present disclosure includes a processor, an overhead rail, a plurality of hangers that support the overhead rail, a vibration meter measuring vibration from the overhead rail, and a damper included in each of the hangers. The processor is configured to change a property of the damper in response to a determination that the measured vibration by the vibration meter is indicative of an abnormal vibration.

20 Claims, 9 Drawing Sheets

Controller
400
Rail 1
202
212
206
230
254
252
204
V3
216
220
208
210
222
232
214
V1
V2
500
502
255
100

(56) References Cited

U.S. PATENT DOCUMENTS

| | | | | |
|---|---|---|---|---|
| 11,515,186 | B2 * | 11/2022 | Yuasa | H01L 21/67769 |
| 2016/0311625 | A1 * | 10/2016 | Zhang | E21F 15/06 |
| 2020/0176294 | A1 * | 6/2020 | Chen | H01L 21/67736 |
| 2022/0285190 | A1 * | 9/2022 | Chen | H01L 21/67706 |

* cited by examiner

Rail 1
Controller
400
220
100

OVERHEAD TRANSPORT SYSTEM

PRIORITY CLAIM AND CROSS-REFERENCE

This application claims the benefit of U.S. Provisional Patent Application No. 63/160,517, filed Mar. 12, 2021, which is incorporated by reference herein in its entirety.

BACKGROUND

To produce semiconductor devices, a semiconductor substrate, such as a silicon wafer, which is a raw material for the semiconductor devices, must go through a sequence of complicated and precise process steps. Often, to complete the sequence, the wafer must be physically transported from one piece of fabrication equipment to another piece of fabrication equipment. Within these pieces of fabrication equipment, various processes such as diffusion, ion implantation, chemical vapor deposition, photolithography, etching, physical vapor deposition, and chemical mechanical polishing are carried out on the semiconductor substrate.

To efficiently move the semiconductor substrate through the sequence and between the different pieces of fabrication equipment in a semiconductor fabrication plant, a plurality of semiconductor substrates is housed in in a portable container such as a front opening unified pod (FOUP) configured to be carried by an overhead transport vehicle. The overhead transport vehicle is configured to travel on overhead rail tracks installed above the fabrication equipment. In general, an overhead hoist transport (OHT) system included in an automated material handling system (AMHS) controls multiple overhead transport vehicles destined to various fabrication equipment in the fabrication plant.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
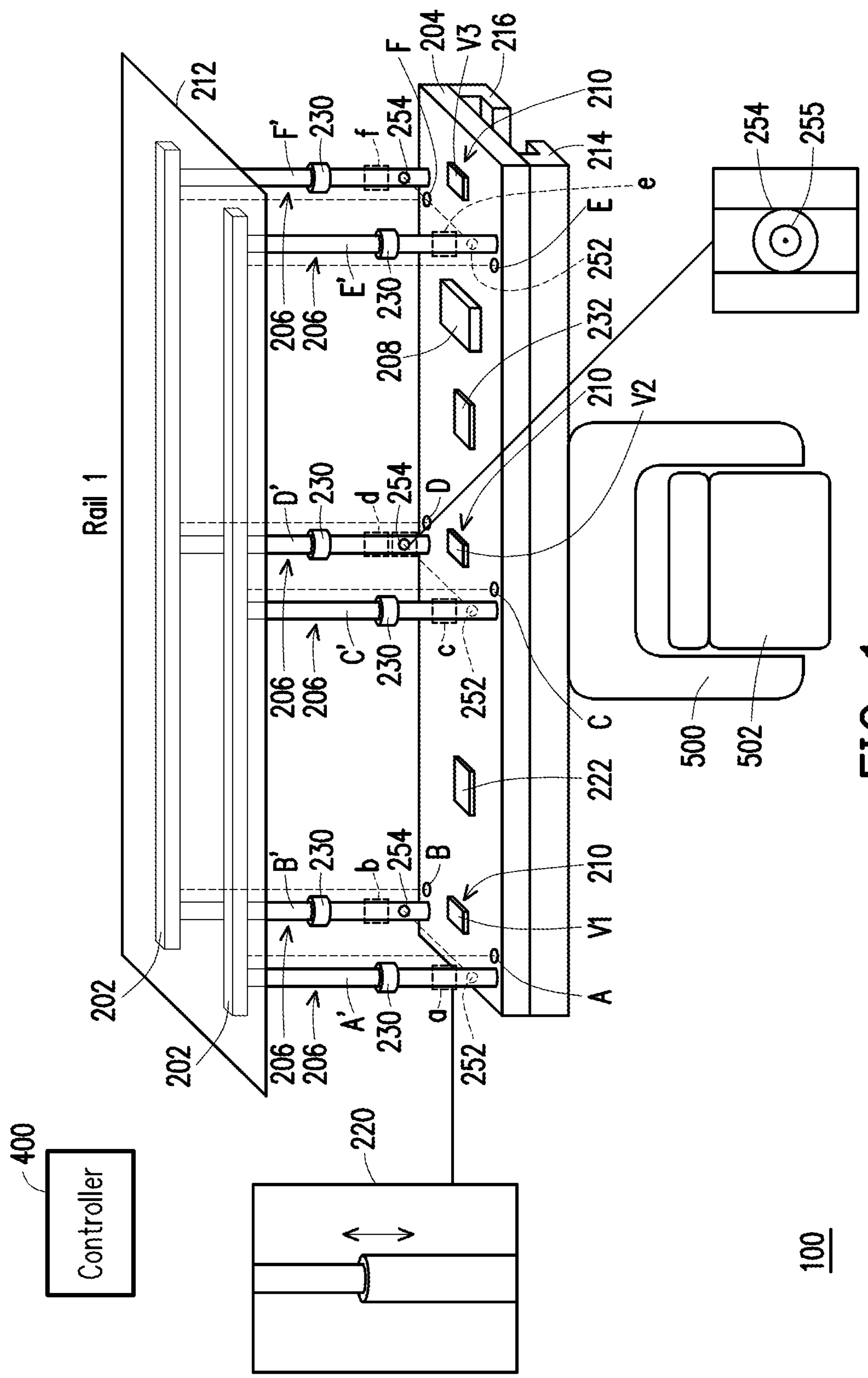
FIG. 1 is a schematic view of a single rail structure of several rail structures, included in an overhead transport system, configured with various components of an overhead rail system and an overhead rail monitoring system according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a modern large-scale semiconductor fabrication plant, when semiconductor substrates (hereinafter "wafers") are transported between one piece of fabrication equipment to another piece of fabrication equipment, they are contained in a lot called a FOUP (wafer cassette), which typically stores 25 wafers at a time. The lots are transported by an overhead hoist transport (OHT) system, which includes multiple overhead vehicles moving at high speeds on an overhead rail system that are hung from a ceiling. The overhead hoist transport (OHT) system is a primary portion of an automated material-handling system (AMHS) in the semiconductor fabrication plant.

Embodiments in accordance with the subject matter described herein include a smart overhead hoist transport (OHT) system (hereinafter "overhead transport system") that is able to transport the lots safely without exposing the wafers in the lots to undesired shock or vibration (hereinafter also referred to "abnormal vibration") by measuring a number of monitoring parameters from various components (and locations) of an overhead rail system included in the overhead transport system and by analyzing the source of the abnormal vibration based on the measurements collected from the monitoring process in order to make proper repairs quickly (e.g., before exposing the excessive or abnormal vibration to subsequent lots). Embodiments of such overhead transport systems include the overhead rail monitoring system capable of providing various monitoring measurement data (e.g., vibration measurement data, level measurement data, distance measurement data, alignment measurement data, and supplemental alignment measurement data). For example, the overhead rail systems in accordance with embodiments described herein include one or more sensors for measuring and generating vibration measurement data, level measurement data, and other measurement data that can be used to identify the source of the undesired shock or vibration in a real time basis during the operation of the overhead transport system. Embodiments in accordance with the present disclosure also include a controller capable of processing and analyzing the measurement data provided by the sensors and determining the source that is causing the undesired shock or vibration. The overhead rail systems in accordance with some embodiments described herein include a plurality of hangers that are capable of adjusting the level of a rail structure of the overhead rail to a proper level or slope (e.g., between −6° and 6°). This adjusting capability is especially useful when multiple rail structures of the overhead rail are not properly leveled at the same time due to a nature event (e.g., earthquake). The overhead rail systems in accordance with some embodiments described herein are capable of actively absorbing (or damping) the undesired shock or vibration to reduce the damage to the wafers in the lots.

The overhead transport system according to one or more embodiments disclosed in the present disclosure is able to identify the source of the undesired shock or vibration based on the monitoring measurement data collected from the sensors in a real time basis. This will significantly reduce the time required to locate the source of the undesired vibration or shock.

The overhead transport system according to one or more embodiments disclosed in the present disclosure is able to respond immediately when the overhead transport vehicle is identified as the source of the undesired vibration. For example, the controller of the overhead transport system is configured to transmit an overhead transport vehicle control signal to command the overhead transport vehicle identified as the source of the undesired vibration to release the FOUP to a nearest FOUP drop location in some embodiments.

The overhead transport system according to one or more embodiments disclosed in the present disclosure is able to respond immediately when a portion of the rail system (e.g., one of rail structures that form the overhead rail) is identified as the source of the undesired vibration. For example, the controller of the overhead transport system is configured to transmit the overhead transport vehicle control signal to all of the overhead transport vehicles in the overhead transport system to take alternate routes.

FIG. 1 is a schematic view of single rail structure 204 of several rail structures 204, included in an overhead transport system 100, configured with various components of overhead rail system 200 and overhead rail monitoring system 300 according to one or more embodiments of the present disclosure.

Referring to FIG. 1, the overhead transport system 100 includes the overhead rail system 200 configured to provide the overhead rail (that provides one or more tracks), that is hung from the ceiling of the semiconductor fabrication plant, for multiple overhead transport vehicles 500 which are configured to carry FOUPs 502 from one location to another location (e.g., load port of a fabrication equipment) based on fabrication sequences assigned to the wafers in the FOUPs 502. As shown in FIG. 1, in some embodiments, the overhead rail system 200 includes two raceways 202 that are spaced apart from each other in parallel. Each of the raceways 202 is mounted on the ceiling 212 of the semiconductor fabrication plant. Raceways 202 arranged in a parallel fashion provide mounting locations for hangers 206 that are configured to hold the rail structures 204 on which the overhead transport vehicles 500 are configured to travel. As shown in FIG. 1, in some embodiments, the rail structure 204 includes an “L” shape rail on a left side 214 of the rail structure 204 and a left-right reversal of the “L” shape rail 216 on a right side of the rail structure 204. Each of the hangers 206 has a first side which is attached to one of the raceways 202 and a second side which is attached to one of the rail structures 204. As shown in FIG. 1, in some embodiments, a plurality of hangers 206 (A', B', C', D', E' and F'), which are attached to the raceways 202, are configured to securely hold the rail structure 204. The overhead rail is formed by aligning multiple rail structures 204 in a serial format. As a result, the overhead transport vehicles 500 can travel along the overhead rail from one location to another location.

As illustrated in the left exploded portion of FIG. 1, in some embodiments, each of the hangers 206 has an adjustable link member 220 that is capable of increasing or decreasing its length. Adjustable link member 220 is configured such that by adjusting (e.g., increasing or decreasing) its own length, a length of the hanger 206 including the adjustable link member 220 also changes accordingly. In some embodiments, each of the adjustable link members 220 (a, b, c, d, e, and f) is being utilized (e.g., adjusted) individually to level the rail structure 204 at a proper level or slope (e.g., between −6° and 6°). In some embodiments, each of the adjustable link members 220 (a, b, c, d, e, and f) is being utilized (e.g., adjusted) collectively to level the rail structure 204 at a proper level or slope (e.g., between −6° and 6°). In some embodiments, each of the adjustable link members 220 is controlled by a link member driver 222 which is controlled by a controller 400.

As illustrated in FIG. 1, in some embodiments, each of the hangers 206 has a damper 230 that is capable of damping (e.g., absorbing) the undesired shock or vibration which can be measured or detected from the rail structure 204 held by the hangers 206. The damper 230 may be any damper, suspension, shock absorber or other structure suitable to damp or absorb shock or vibration from the rail structure 204. In some embodiments, the damper 230 is a magnetorheological damper which is filled with magnetorheological fluid. By adjusting an electromagnetic field surrounding the magnetorheological fluid in the magnetorheological damper, the properties of the magnetorheological damper changes, which helps in attenuating the abnormal vibration. In some embodiments, a damper driver 232 is configured to adjust the current which is being supplied to each of the dampers 230 if each of the hangers 206 includes magnetorheological damper as the damper 230. When the damper driver 232 increases the current to a particular damper 230, the intensity of the electromagnetic field surrounding the magnetorheological fluid in the particular damper 230 increases. As a result, the metal particles in the magnetorheological fluid are aligned according to the electromagnetic field that increases the viscosity of the magnetorheological fluid in the particular damper 230. Likewise, when the damper driver 232 decreases the current to the particular damper 230, the intensity of the electromagnetic field surrounded the magnetorheological fluid in the particular damper 230 decreases. As a result, the metal particles in the magnetorheological fluid are disjoined from each other, and that decreases the viscosity of the magnetorheological fluid in the particular damper 230. In other words, in some embodiments of the present disclosure, the damper driver 232 is configured to adjust the viscosity of magnetorheological fluid in each of the dampers 230 individually or collectively to attenuate the abnormal vibration based on a damping control signal from the controller 400 (e.g., increasing the current to the damper 230). In the present embodiment, the controller 400 is configured to transmit the damping control signal to the damper driver 232 to increase the current to the particular damper 230. In some embodiments, the damper 230 has a suitable tension control mechanism which does not require the magnetorheological fluid.

Figure 2:
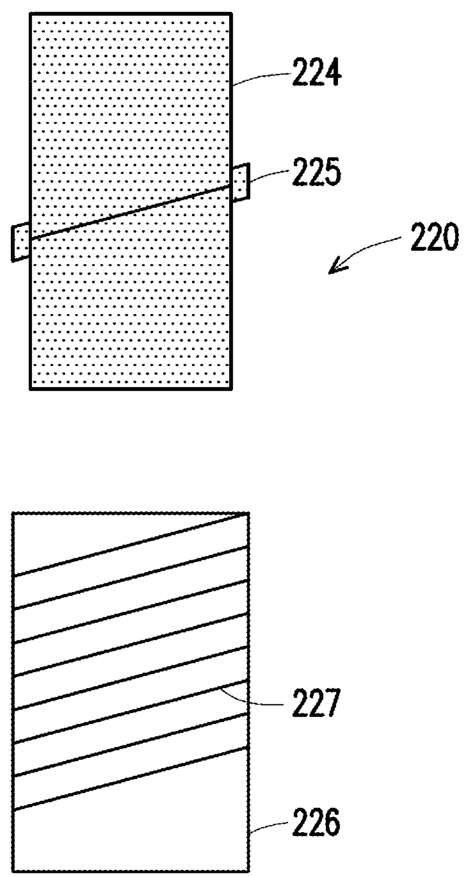
FIG. 2 is a side exploded view of an adjustable link member included in a hanger according to one or more embodiments in the present disclosure.

FIG. 2 is a side exploded view of the adjustable link member 220 included in the hanger 206 according to one or more embodiments in the present disclosure.

Figure 3:
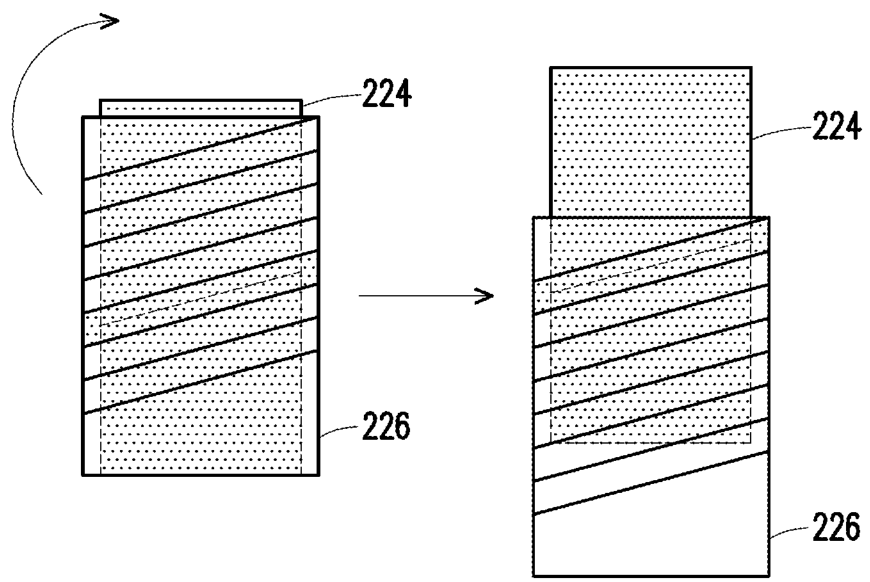
FIGS. 3 and 4 are side views of the adjustable link member included in the hanger according to one or more embodiments in the present disclosure.
Figure 4:
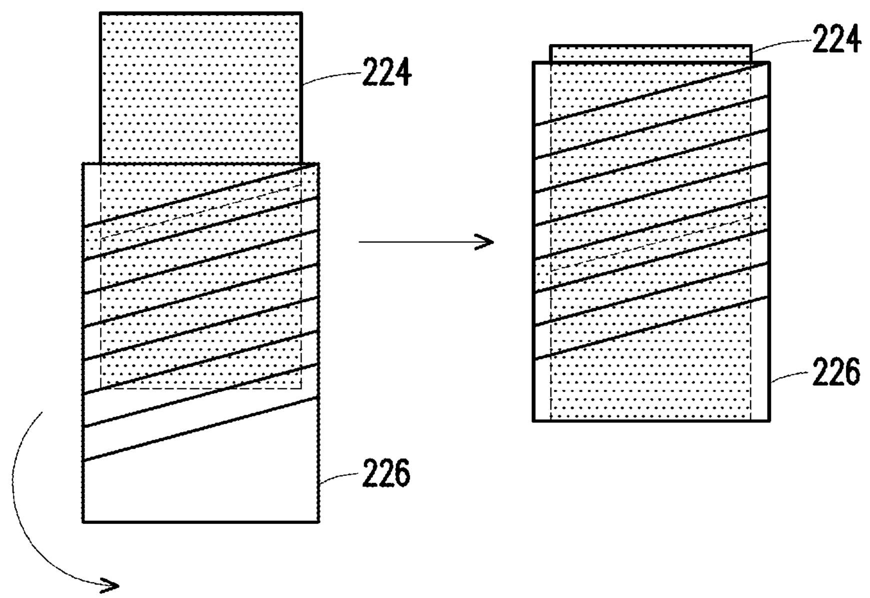

FIGS. 3 and 4 are side views of the adjustable link member 220 included in the hanger 206 according to one or more embodiments in the present disclosure.

Referring to FIGS. 2-4, in some embodiments, each of the adjustable link members 220 may include an inner hollow member 224 and an outer hollow member 226; however, embodiments provided herein are not limited thereto and in various embodiments the adjustable link members 220 may be any link structure having an adjustable length. In some embodiments, to adjust the length of the link member 220, the inner hollow member 224 is configured to rotate in the outer hollow member 226. As the inner hollow member 224 is rotated in a first direction, the length of the link member 220 becomes shorter. Likewise, as the inner hollow member 224 is rotated in a second direction, the length of the link member 220 becomes longer.

In the illustrated embodiment shown in FIGS. 2-4, the outer hollow member 226 includes internal threads (e.g., helical grooves) 227, and the inner hollow member 224 includes a protrusion 225 (e.g., partial helical protrusion) that fits to the internal threads 227 during the rotating movement. In some embodiments, the length for each of the link members 220 can be adjusted by rotating the inner hollow member 224 using any suitable rotating mechanism, such as a step motor (not shown), controlled by the link member driver 222. For example, the link member driver 222 is configured to control the rotating movement of the inner hollow member 224 until the length of hanger 206 is adjusted to a predetermined length. In some embodiments, the adjustment link member 220 included in the hanger 206 contain a suitable expansion mechanism which can be used to adjust the length of the hanger 206 to the predetermined length.

Referring back to FIG. 1, the overhead transport system 100 includes the overhead rail monitoring system 300 configured to collect the measurement data from the rail structure 204. As shown in FIG. 1, in some embodiments, the overhead rail monitoring system 300 includes an electronic level meter 208 installed on the rail structure 204 or other suitable location where the electronic level meter 208 is able to collect the level measurement data of the rail structure 204. In some embodiments, the overhead rail monitoring system 300 includes more than one electronic level meter 208 for each of the rail structures 204. In the present embodiment shown in FIG. 1, the overhead rail monitoring system 300 includes one electronic level meter 208 for each of the rail structures 204.

In the present embodiment, the electronic level meter 208 is an Internet of things (IoT) device (with its own IP address) configured to transmit the level measurement data of the rail structure 204 (e.g., slope measured from the rail structure 204) wirelessly to the controller 400 on a real time basis. For example, the electronic level meter 208 is configured to communicate with the controller 400 via the Internet. However, the present disclosure does not limit the electronic level meter 208 to be an Internet of things (IoT) device. In some embodiments, the electronic level meter 208 is configured to transmit the level measurement data via a suitable network using a suitable protocol (e.g., wired network) to the controller 400.

In some embodiments, the overhead rail monitoring system 300 includes one or more vibration meters 210 installed on each of the rail structures 204. In the present embodiment, three vibration meters 210 (V1, V2, and V3) are attached on the top surface of the rail structure 204. In some embodiments, one or more vibration meters 210 are attached to other suitable locations for indirectly measuring and generating the vibration measurement data of the rail structure 204 (e.g., hanger 206 and raceways 202). As discussed above, in the present embodiment, the overhead rail monitoring system 300 includes three vibration meters 210 (V1, V2, and V3) for one rail structure 204. As shown in FIG. 1, a first vibration meter 210 (V1) is located at a first end of the rail structure 204 between the hangers 206 (A' and B'), a second vibration meter 210 (V2) is located at the middle of the rail structure 204 between the hangers 206 (C' and D'), and a third vibration meter 210 (V3) is located at a second end of the rail structure 204.

In the present embodiment, each of the vibration meters 210 is the Internet of things (IoT) device (with its own IP address) configured to transmit the vibration measurement data taken from the rail structure 204 wirelessly to the controller 400 on a real time basis. For example, the vibration meters 210 are configured to communicate with the controller 400 via the Internet. However, the present disclosure does not limit that the vibration meter 210 be an Internet of things (IoT) device. In some embodiments, the vibration meter 210 is configured to transmit the vibration measurement data via a suitable network using a suitable protocol (e.g., wired network) to the controller 400.

As shown in FIG. 1, in some embodiments, the overhead rail monitoring system 300 includes rangefinders 240 installed on each of the rail structures 204 to measure the distance between the rail structures 204 and the raceways 202 at different locations. For example, in the present embodiment, each of the rangefinders 240 (A, B, C, D, E, F, and G) is installed on the rail structure 204 within a proximate range from one of the hangers 206 (A', B', C', D', E', F', and G'). Due to the placement of each of the rangefinders 240 (A, B, C, D, E, F, and G), the current length for each of the hangers 206 can be measured on a real time basis using the rangefinders 240. In some embodiments, the controller 400 is configured to determine whether the rail structure 204 is properly leveled (e.g., between −6° and 6°) based on the distance measurement data that includes the length for each of the hangers 206. In some embodiments, the controller 400 is configured to compare the length measured for each of the hangers 206 with a predetermined length. In some embodiments, each of the hangers 206 has an individualized predetermined length. In some embodiments, each of the hangers 206 has one predetermined length (with a predetermined tolerance).

In the present embodiment, each of the rangefinders 240 is the Internet of things (IoT) device configured to transmit the distance measurement data (i.e., data including length for each of the hangers 206) wirelessly to the controller 400 on a real time basis. For example, the rangefinders 240 are configured to communicate with the controller 400 via the Internet. However, the present disclosure does not limit the rangefinder 240 to be the Internet of things (IoT) device. In some embodiments, the rangefinder 240 is configured to transmit the distance measurement data via a suitable network using a suitable protocol (e.g., wired network) to the controller 400.

In the present embodiment, each of the rangefinders 240 includes a laser beam emitter to determine the distance between the rail structures 204 and the raceways 202 at the different locations (i.e., length for each of the hangers 206) based on the time of flight principle. For example, the rangefinder 240 determines the distance (i.e., length of the hanger 206) by sending a laser pulse in a narrow beam towards the raceways 202 and by measuring the time taken by the pulse to be reflected off the raceways 202 and returned to the rangefinder 240. However, the present disclosure does not limit the rangefinder 240 to be a laser rangefinder using the time of flight principle. For example, the rangefinder 240 can be at least one of laser rangefinder using the triangulation method, lidar rangefinder, radar rangefinder, sonar rangefinder, or ultrasonic rangefinder.

As shown in FIG. 1, in some embodiments, the overhead rail monitoring system 300 includes at least one alignment check device 250. In some embodiments, the alignment check device 250 may include a light emitter (e.g., a laser emitter 252) and a light sensor (e.g., a laser sensor 254). In the present embodiment, each of first hangers (e.g., A', C', and E') includes the laser emitter 252 and each of second hangers (e.g., B', D', and F') that is facing the first hangers (e.g., A', C', and E'), respectively, includes the laser sensor 254. Each of the laser sensors 254 is able to determine whether the rail structure 204 is leveled at a proper level or slope at different locations. For example, in the present disclosure, the laser sensor 254 included in the second hanger 206 (B') is configured with a laser detection surface to detect the laser emitted from the laser emitter 252 included in the first hanger 206 (A'). Based on the laser location detected on the laser detection surface of the laser sensor 254 (e.g., within the predetermined center area 255 of the laser detection surface of the laser sensor 254), the controller 400 is able to determine whether the rail structure 204 is leveled at a proper level or slope between two hangers (A' and B'). For example, in some embodiments, when the laser emitted from the laser emitter 252 is not detected within the predetermined center area 255 of the laser detection surface, the processor 406 of the controller 400 is configured to determine that the rail structure 204 is not at the proper level. In some embodiments, the controller 400 is able to determine whether the rail structure 204 is deformed (e.g., warpage) based on the alignment measurement data.

In the present embodiment, each of the alignment check devices 250 is an Internet of things (IoT) device configured to transmit the alignment measurement data wirelessly to the controller 400 on a real time basis. For example, the alignment check device 250 is configured to communicate with the controller 400 via the Internet. However, the present disclosure does not limit the alignment check device 250 to be the Internet of things (IoT) device. In some embodiments, the alignment check device 250 is configured to transmit the alignment measurement data via a suitable network (e.g., wired network) to the controller 400.

Figure 5:
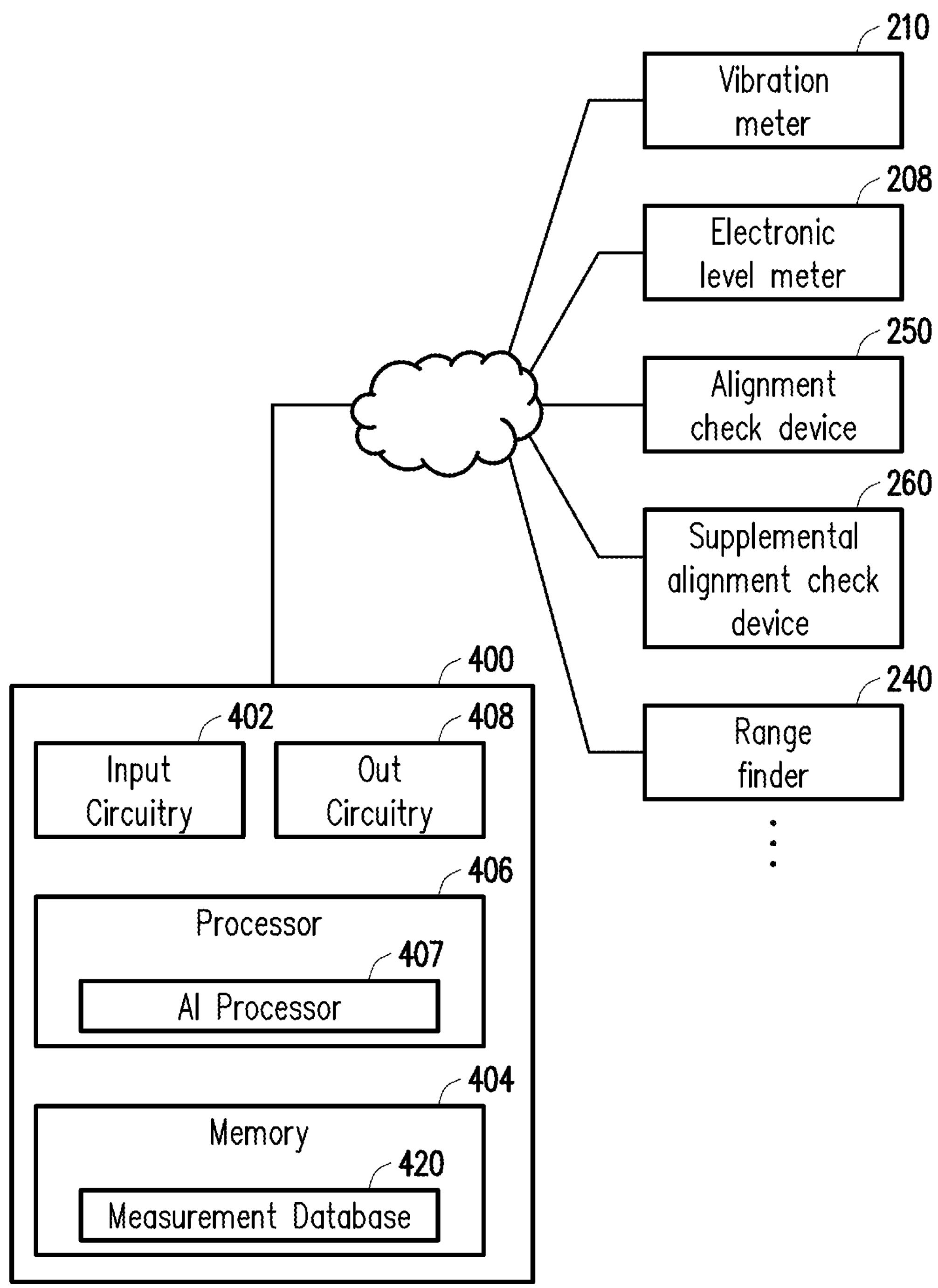
FIG. 5 is a block diagram illustrating a controller according to one or more embodiments of the present disclosure.

FIG. 5 is a block diagram illustrating a controller 400 according to one or more embodiments of the present disclosure.

In accordance with one or more embodiments of the present disclosure, the controller 400 includes an input circuitry 402, a memory 404, a processor 406, and an output circuitry 408. Controller 400 includes the (computer) processor 406 configured to perform the various functions and operations described herein including receiving input data from various data sources (e.g., distance measurement data from the rangefinder 240, level measurement data from the electronic level meter 208, vibration measurement data from the vibration meter 210, alignment measurement data from the alignment check device 250, and supplemental alignment measurement data from the supplemental alignment check device 260) via the input circuitry 402 and transmitting output data (e.g., damping control signal to the damper driver 232 and adjustment signal to the link member driver 222) via the output circuitry 408. In some embodiments, the processor 406 stores the distance measurement data, level measurement data, vibration measurement data, alignment measurement data, and supplemental alignment measurement data received via the input circuitry 402 as a measurement database 420 in the memory 404. Memory 404 may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

In some embodiments, the processor 406 includes an artificial intelligence processor 407 that is used to determine the source of the abnormal vibration by employing one or more artificial intelligence techniques.

"Artificial intelligence" is used herein to broadly describe any computationally intelligent systems and methods that can learn knowledge (e.g., based on training data), and use such learned knowledge to adapt their approaches for solving one or more problems, for example, by making inferences based on a received input such as vibration measurement data received via the input circuitry 402. Artificially intelligent machines may employ, for example, neural network, deep learning, convolutional neural network, Bayesian program learning, and pattern recognition techniques to solve problems such as determining the source of the abnormal vibration. Further, artificial intelligence may include any one or any combination of the following computational techniques: constraint program, fuzzy logic, classification, conventional artificial intelligence, symbolic manipulation, fuzzy set theory, evolutionary computation, cybernetics, data mining, approximate reasoning, derivative-free optimization, decision trees, and/or soft computing. Employing one or more computationally intelligent techniques, the artificial intelligence processor 407 may learn to determine the source of the abnormal vibration based on the information stored in the measurement database 420 (i.e., database or training database, as will be described in FIG. 6). In some embodiments, the artificial intelligence processor 407 updates the measurement database 420 as various measurements are received via the input circuitry 402. In some embodiments, the artificial intelligence processor 407 may learn to predict the source of the abnormal vibration based on the intelligent techniques.

Figure 6:
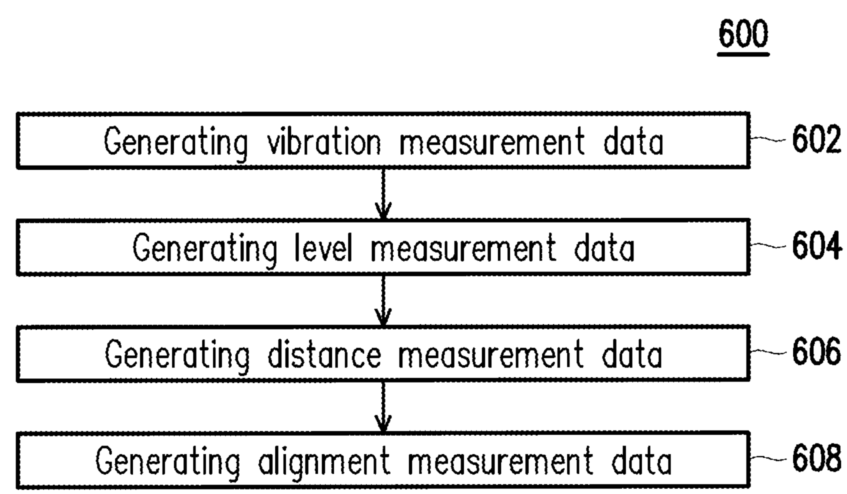
FIG. 6 is a flowchart illustrating a method of maintaining a measurement database implemented by the overhead transport system according to one or more embodiments of the present disclosure.

FIG. 6 is a flowchart illustrating a method 600 of maintaining the measurement database 420 implemented by the overhead transport system 100 according to one or more embodiments of the present disclosure.

Method 600 includes an operation 602 of measuring and generating the vibration measurement data from each of the rail structures 204 using the vibration meters 210. As discussed above, each of the vibration meters 210 is configured to collect and transmit the vibration measurement data taken from different locations of the rail structures 204 to the controller 400 on a real time basis. In some embodiments, the vibration measurement data includes a frequency of the measured vibration over a predetermined period. In some embodiments, the vibration measurement data includes an amplitude of the measured vibration. In some embodiments, the vibration measurement data includes both the frequency of the measured vibration and the amplitude of the measured vibration. In some embodiments, the vibration measurement data includes measurements which can be collect by an accelerometer included in each of the vibration meters 210. In some embodiments, the vibration measurement data includes information that can be used to identify the overhead transport vehicle which was traveling the same rail structure 204 being monitored by the vibration meter 219.

In the present embodiment, each of the vibration meters 210 is the Internet of things (IoT) device that is equipped to transmit the vibration measurement data wirelessly. In the present embodiment, the input circuitry 402 of the controller 400 is configured to communicate with the Internet of things (IoT) devices (such as the vibration meters 210) and also configured to receive data from the Internet of things (IoT) devices (such as the vibration meters 210). For example, the processor 406 of the controller 400 stores the vibration measurement data received via the input circuitry 402 to the measurement database 420 in the memory 404.

In the present embodiment, as shown in FIG. 1, three vibration meters 210 (V1, V2, and V3) are installed at different locations on the rail structure 204. Each of vibration meters 210 is configured to measure the vibration at its location and configured to transmit the measured vibration (i.e., vibration measurement data) to the controller 400. In some embodiments, each of the vibration meters 210 is configured to transmit its location (e.g., rail structure number and location number or suitable location identifier such a vibration meter identification number) and the vibration measurement data collected to the controller 400. In some embodiments, upon receiving the vibration measurement data (with location and overhead transport vehicle information), the processor 406 updates the measurement database 420 in the memory 404 by storing the vibration measurement data, the location information, and the overhead vehicle information. As will be described later in the present disclosure, in some embodiments, the processor 406 is configured to determine the source of the abnormal vibration (e.g., 0.3G or greater) based on the measurement database 420. In some embodiments, the processor 406 is configured to predict the source of the abnormal vibration before the vibration source causes such abnormal vibration based on the measurement database 420.

Method 600 includes an operation 604 of measuring and generating the level measurement data from each of the rail structures 204 using the electronic level meters 208. As discussed above, the electronic level meter 208 is configured to collect and transmit the level measurement data taken from the rail structure 204 to the controller 400 on a real time basis. In some embodiments, the level measurement data includes the slope of the rail structure 204. In some embodiments, the level measurement data includes the overhead transport vehicle information.

In the present embodiment, the electronic level meter 208 is the Internet of things (IoT) device that is equipped to transmit the level measurement data wirelessly. In the present embodiment, the input circuitry 402 of the controller 400 is configured to communicate with the Internet of things (IoT) devices (such as the electronic level meter 208) and also configured to receive data from the Internet of things (IoT) devices (such as the electronic level meter 208). In the present embodiment, the processor 406 stores the level measurement data received via the input circuitry 402 to the measurement database 420 along with vibration measurement data in the memory 404.

Method 600 includes an operation 606 of measuring and generating the distance measurement data using the rangefinders 204. As discussed above, the rangefinders 204 are configured to collect and transmit the distance measurement data (i.e., length for each of the hangers 206) collected from the rail structure 204 to the controller 400 on a real time basis. In some embodiments, the distance measurement data includes the overhead transport vehicle information.

In the present embodiment, each of the rangefinders 204 is the Internet of things (IoT) device that is equipped to transmit the distance measurement data wirelessly. In the present embodiment, the input circuitry 402 of the controller 400 is configured to communicate with the Internet of things (IoT) devices (such as the rangefinder 204) and also configured to receive data from the Internet of things (IoT) devices (such as the rangefinder 204). In the present embodiment, the processor 406 stores the distance measurement data received via the input circuitry 402 to the measurement database 420 along with vibration measurement data and the level measurement data in the memory 404.

Method 600 includes an operation 608 of measuring and generating the alignment measurement data of the rail structure 204 using the alignment check devices 250. As discussed above, the alignment check devices 250 are configured to collect and transmit the alignment measurement data collected from the rail structures 204 to the controller 400 on a real time basis. In some embodiments, the alignment measurement data includes the overhead transport vehicle information.

In the present embodiment, each of the alignment check devices 250 is the Internet of things (IoT) device that is equipped to transmit the alignment measurement data wirelessly. In the present embodiment, the input circuitry 402 of the controller 400 is configured to communicate with the Internet of things (IoT) devices (such as the alignment check device 250) and also configured to receive data from the Internet of things (IoT) devices (such as the alignment check device 250). In the present embodiment, the processor 406 stores the alignment measurement data received via the input circuitry 402 to the measurement database 420 along with vibration measurement data, the level measurement data and distance measurement data in the memory 404.

In the present embodiment, the operations 602, 604, 606, and 608 are carried out by the processor 406 simultaneously. In some embodiments, the operations 602, 604, 606, and 608 are carried out by the processor 406 sequentially.

Figure 7:
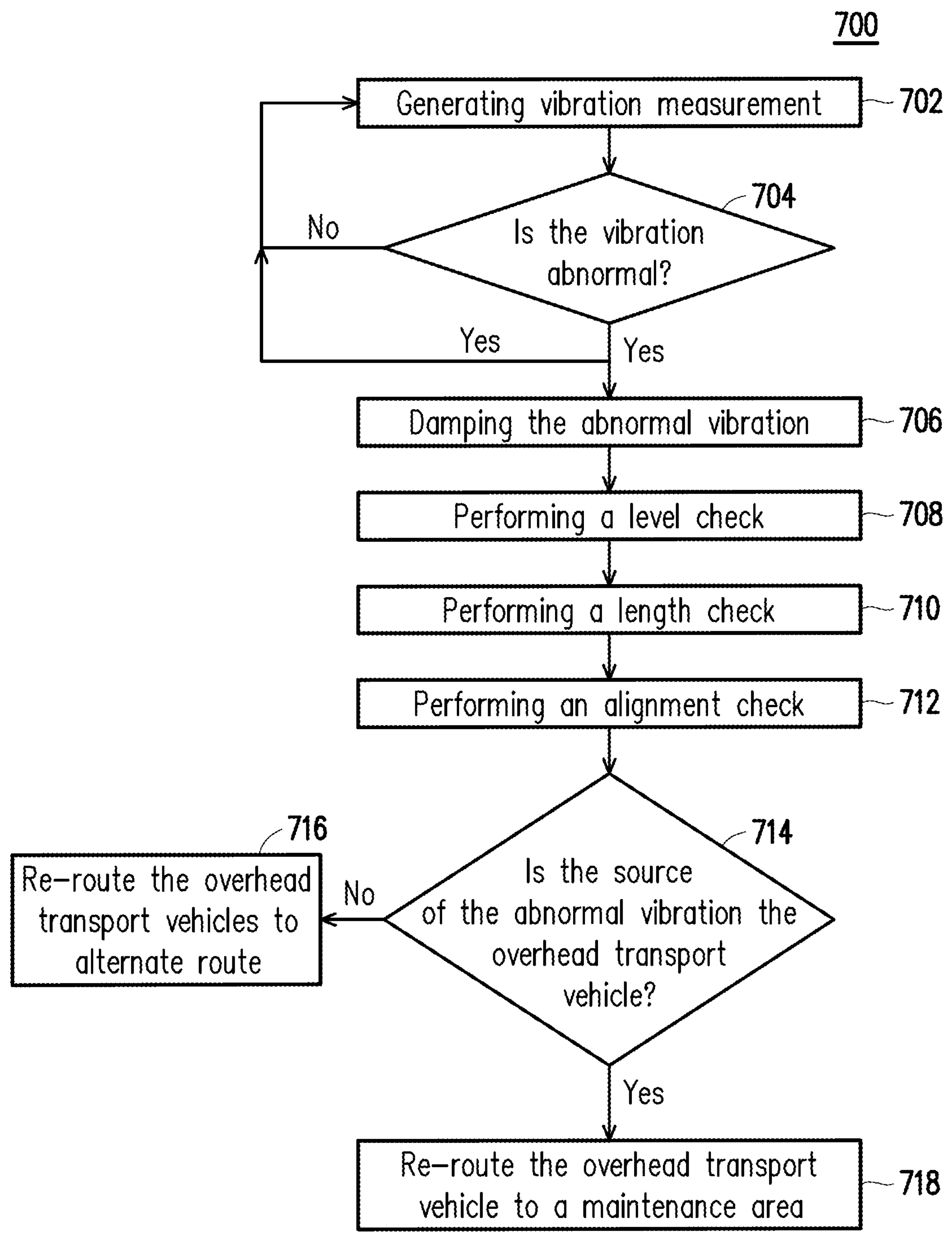
FIG. 7 is a flowchart illustrating a method of determining a source of an abnormal vibration implemented by the overhead transport system according to one or more embodiments of the present disclosure.

FIG. 7 is a flowchart illustrating a method 700 of determining the source of the abnormal vibration implemented by the overhead transport system 100 according to one or more embodiments of the present disclosure.

Method 700 includes an operation 702 of measuring and generating the vibration measurement data from each of the rail structures 204 using the vibration meters 210.

As discussed above, each of the vibration meters 210 is configured to collect and transmit the vibration measurement data taken from different locations of the rail structures 204 to the controller 400 on a real time basis. In the present embodiment, the vibration meter 210 is the Internet of things (IoT) device that is equipped to transmit the vibration measurement data wirelessly.

In the present embodiment, as shown in FIG. 1, three vibration meters 210 (V1, V2, and V3) are installed at different locations on the rail structure 204. Each of vibration meters 210 is configured to measure the vibration at the current location and configured to transmit the measured vibration (i.e., vibration measurement data) to the controller 400. In some embodiments, each of the vibration meters 210 is configured to transmit the current location (e.g., rail structure number and location number or other suitable location identifier such a vibration identification number) and the vibration measurement data to the controller 400. In some embodiments, upon receiving the vibration measurement data, the processor 406 is configured to update the measurement database 420 in the memory 404 by storing the vibration measurement data and the location information. In some embodiments, the processor 406 is configured to store information of the overhead transport vehicle 500 traveling the rail structure 204 along with vibration measurement data and location information to the measurement database 420.

Method 700 includes an operation 704 of determining whether the vibration measured from all of the vibration meters 210 is within a range of predetermined values by the processor 406 of the controller 400 (e.g., 0.3G or less). In some embodiments, the value is a frequency of the measured vibration over a predetermined period. In some embodiments, the value is an amplitude of the measured vibration. In some embodiments, the value includes both the frequency of the measured vibration and the amplitude of the measured vibration. If the processor 406 determines that the measured vibration is within the range of predetermined values, the processor 406 is configured to continuously monitor and store the vibration measurement data that is being updated by the vibration meters 210 in the measurement database 420. If the processor 406 determines that the measured vibration is representative of an abnormal vibration (e.g., not within the predetermined range), the processor 406 is configured to continuously monitor the vibration and to transmit the damping control signal to the damper driver 232 corresponding to a particular location where the abnormal vibration was measured (via wired or wireless network). In some embodiments, the processor 406 is configured to store the abnormal vibration measured (e.g., vibration measurement data) and the particular location where the undesired vibration was measured (e.g., location of the vibration meter 210 which detected the undesired vibration) and the overhead transport vehicle information in the measurement database 420.

Method 700 includes an operation 706 of damping (e.g., reducing and attenuating) the abnormal vibration to decrease the likelihood of damaging the wafers in the FOUPs when the FOUPs are passing the particular location or rail structure 204 (e.g., location of vibration meter V2 between hanger C' and hanger D'). As discussed above, in the present embodiment, the damper 230 is included in each of the hangers 206 holding the rail structure 204. Damper 230 is configured to absorb the undesired shock or vibration based on the damping control signal. In some embodiments, the processor 406 transmits the damping control signal along with the location where the undesired shock or vibration was detected to the damper driver 232 which supplies current to each of the damper 230. Based on the damping control signal, the damper driver 232 increases or decreases the current supplied to the dampers 230 located at the particular location (e.g., dampers 230 in the hangers C' and D') where the undesired shock or vibration was measured to attenuate the vibration. For example, the damper driver 232 increases the current to the dampers 230 located near the particular location (e.g., dampers 230 in the hangers C' and D') to increase the viscosity of the magnetorheological fluid in the dampers 230 to attenuate the abnormal vibration. In some embodiments, based on the damping control signal, the damper driver 232 increases the current supplied to all of the dampers 230 in the hangers 206 holding the rail structure 204 where the abnormal vibration was detected. For example, the damper driver 232 increases the current to the dampers 230 in the hangers 206 (A', B', C', D', E', and F'). In some embodiments, based on the damping control signal, the damper driver 232 increases the current supplied to all of the dampers 230 in the hangers 206 holding the rail structure 204 and other rail structure 204 adjacent to the rail structure 204.

In some embodiments, various determining steps are also performed based on several measurements of data taken from the rail structure 204 from which the undesired shock or vibration was detected, as described below.

Method 700 includes an operation 708 of determining whether the rail structure 204 from which the abnormal vibration was detected is leveled within a predetermined value (e.g., slope between −6° and 6°) by the processor 406 based on the level measurement data taken by the electronic level meter 208. In the present embodiment, the electronic level meter 208 is the Internet of things (IoT) device that is equipped to transmit the level measurement data over the Internet.

Method 700 includes an operation 710 of determining the length for each of the hangers 206 holding the rail structure 204 from which the abnormal vibration was detected by the processor 406. As shown in FIG. 1, due to the placement of each of the rangefinders 240 (A, B, C, D, E, and F), the current length of each of the hangers 206 (A', B', C', D', E', and F') can be measured by the rangefinders 240. Furthermore, in the present embodiment, the processor 406 is configured to determine whether each of the hangers 206 that supports the rail structure 204, from which the abnormal vibration was detected, has a length that is normal. For example, the processor 406 is configured to determine whether all of the hangers 206 have the same length. In another example, the processor 406 is configured to determine whether all of the hangers 206 are within a predetermined length range. In some embodiments, the processor 406 is configured to determine whether each of the hangers 206 has a length that is matching with a length individually preset.

In some embodiments, the processor 406 is configured to check only the hangers 206 from which the undesired vibration was detected (e.g., checking the hangers C' and D' only when the vibration meter V2 detected the undesired vibration).

Method 700 includes an operation 712 of determining whether the hangers 206 that support the rail structure 204, from which the undesired vibration was detected, are aligned to each other by the processor 406. Processor 406 is configured to determine whether all of the hangers 206 that support the rail structure 204 are aligned based on the alignment measurement data that is transmitted to the controller 400 via the Internet by each of the alignment check devices 250.

Method 700 includes an operation 714 of determining the source of the undesired shock or vibration based on the results from the operations 706, 708, 710, 712. As discussed above, the results are based on the distance measurement data, alignment measurement data and the level measurement data by the processor 406 of the controller 400. For example, if the processor 406 determines that the rail structure 204 is not leveled within the predetermined value (e.g., the rail structure 204 is tilted at an angle more than 6°) based on the received level measurement data, the processor 406 determines that the source of the measured vibration is the level of the rail structure 204, in some embodiments. In other embodiments, if the processor 406 determines that at least one pair of the hangers 206 that support the rail structure 204 are not aligned to each other based on the alignment measurement data, the processor 406 determines that the source of the measured vibration is the rail structure 204 (particularly, the pair of hangers that are not aligned). In other embodiments, if the processor 406 determines that not all of the hangers 206 have the same length based on the received distance measurement data, the processor 406 determines that the source of the measured vibration is the level of the rail structure 204. In some embodiments, if the processor 406 determines that the rail structure 204 is leveled within the predetermined value and that all of the hangers 206 have the same length and are aligned based on the level measurement data, the distance measurement data, and the alignment measurement data, the processor 406 determines that the source of the measured vibration is the overhead transport vehicle 500 which was traveling on the rail structure 204 when the undesired shock or vibration was measured by at least one of the vibration meters 210. In some embodiments, the operation 714 employs one or more artificial intelligence techniques discussed above to determine the source of the abnormal vibration.

In some embodiments, the processor 406 is configured to compare the vibration measured from the rail structure 204 and vibration measured from other rail structures 204 adjacent to the rail structures 204. If the abnormal vibration measured at the rail structure 204 is not detected by the adjacent rail structures 204, the processor 406 is configured to determine that the source of the abnormal vibration is the rail structure 204. If the abnormal vibration measured at the rail structure 204 is also detected by the adjacent rail structures 204, the processor 406 is configured to determine that the source of the abnormal vibration is the overhead transport vehicle 500 that was on the rail structure 204 when the abnormal vibration was measured.

In some embodiments, the processor 204 is configured to run an additional test if the processor 204 is unable to determine the source of the abnormal vibration. In the present embodiment, the processor 406 is configured to transmit an overhead transport vehicle control signal to send the overhead transport vehicle 500 to a "golden track," the rail structure 204 or rail structures 204 already verified by a technician. If the abnormal vibration is measured while the overhead transport vehicle 500 is traveling on the "golden track," the processor 406 is configured to determine that the source of the abnormal vibration is the overhead transport vehicle 500. If the abnormal vibration is not measured while the overhead transport vehicle 500 is traveling on the "golden track," the processor 406 is configured to determine that the source of the abnormal vibration is the rail structure 204.

Method 700 includes an operation 716 of re-routing the overhead transport vehicles 500 to avoid the rail structure 204 known to be the source of the abnormal vibration. In some embodiments, the processor 406 transmits an overhead transport vehicle control signal with an alternate route to the overhead transport vehicles 500 previously routed to take the rail structure 204. In some embodiments, the operation 716 also includes providing fault information (e.g., measured vibration and corresponding rail structure 204 where the vibration was measured from) to a technician. In some embodiments, the operation 716 further includes storing the measured vibration and the actual failure (e.g., failed part of the rail structure 204) which was determined by the technician to measurement database 420 in the memory 404.

Method 700 includes an operation 718 of re-routing the overhead transport vehicle 500 which was determined as the source of the abnormal vibration to a nearest overhead transport vehicle maintenance area. In some embodiments, the processor 406 transmits an overhead transport vehicle control signal with a route to the nearest overhead transport vehicle maintenance area to the overhead transport vehicle determined as the source of the vibration. In some embodiments, the operation 718 further includes storing the measured vibration and the actual failure (e.g., failed part of the overhead transport vehicle 500) which was determined by the technician to the measurement database 420 in the memory 404.

Figure 8:
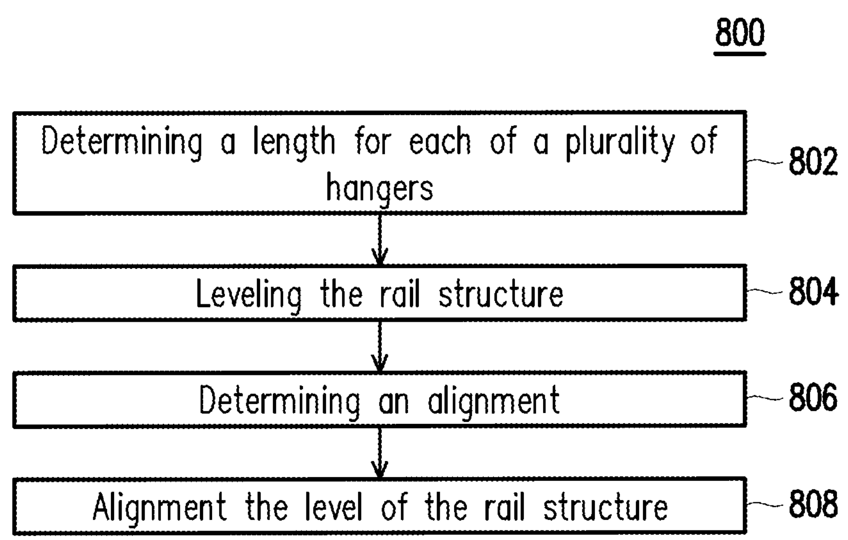
FIG. 8 is a flowchart illustrating a method of a rail structure leveling process implemented by the overhead transport system according to one or more embodiments of the present disclosure.

FIG. 8 is a flowchart illustrating a method of a rail structure leveling process 800 implemented by the overhead transport system 100 according to one or more embodiments of the present disclosure.

Method 800 includes an operation 802 of determining the lengths of the plurality of hangers 206. In some embodiments, the operation 802 includes collecting the distance between the rail structure 204 and the raceways 202 at different locations within the rail structure 204 (from which the abnormal vibration was detected) to obtain the length for each of the hangers 206 that supports the rail structure 204 on a real time basis. In some embodiments, each of the rangefinders 240 is located on the top surface of the rail structure 204 or embedded into the surface of the rail structure 204 to measure each length of the hangers 206. In the present embodiment, each of the rangefinders 240 (A, B, C, D, E, and F) is arranged on the rail structure 204 to measure and transmit the each length of the hangers 206 (A', B', C', D', E', and F') that support the rail structure 204 on a real time basis to the controller 400. In some embodiments, upon receiving the distance measurement data (i.e., length for each of the hangers 206) from each of the rangefinders 240, the processor 406 is configured to check the lengths as described in the operation 710 above.

Method 800 includes an operation 804 of leveling the rail structure 204. In some embodiments, the operation 804 includes adjusting the hangers 206 based on the distance measurement data collected during the operation 802. In some embodiments, the processor 406 is configured to transmit the adjustment signal to the link member driver 222. In response to the adjustment signal, the link member driver 222 adjusts the length for each of the hangers 206 with an abnormal length (e.g., length that is shorter or longer than the predetermined length) to the predetermined or desired length. As discussed above, the link member driver 222 is configured to control the suitable expansion mechanism (e.g., step motor, inner hollow member 224, and outer hollow member 226) that is capable of adjusting the length of the hanger 206 to the predetermined or desired length. In some embodiments, the operations 802 and 804 are looped until all of the hangers 206, which support the rail structure 204, have the predetermined or desired length.

Method 800 includes an operation 806 of determining the alignment of the hangers 206. In some embodiments, the operation 806 includes confirming the alignment of the hangers 206 that supports the rail structure 204 from which the abnormal vibration was detected. As discussed above, in the present embodiment, each of first hangers (e.g., A', C', and E') includes the laser emitter 252 and each of second hangers (e.g., B', D', and F') that face the first hangers (e.g., A', C', and E'), respectively, includes the laser sensor 254. In the present disclosure, the laser sensor 254 included in the second hanger 206 (B') is configured to detect the laser emitted from the laser emitter 252 included in the first hanger 206 (A') and the laser sensor 254 included in the second hanger 206 (D') is configured to detect the laser emitted from the laser emitter 252 included in the first hanger 206 (C'). Likewise, the laser sensor 254 included in the second hanger 206 (F') is configured to detect the laser emitted from the laser emitter 252 included in the first hanger 206 (E'). As discussed above, each of the laser sensors 254 transmits the alignment measurement data to the controller 400. Based on the alignment measurement data, the processor 406 confirms or determines whether all of the hangers 206 are aligned. In some embodiments, the operations 802, 804, and 806 are looped until the processor 406 determines that all of the hangers 206 are aligned. In some embodiments, method 800 includes an operation 808 of determining the level of the rail structure 204. For example, the operation 808 includes confirming the level of the rail structure 204 using the level measurement data. In some embodiments, the operations 802, 804, 806 and 808 are looped until the processor 406 determines that the rail structures 204 is leveled with the proper slope.

Figure 9:
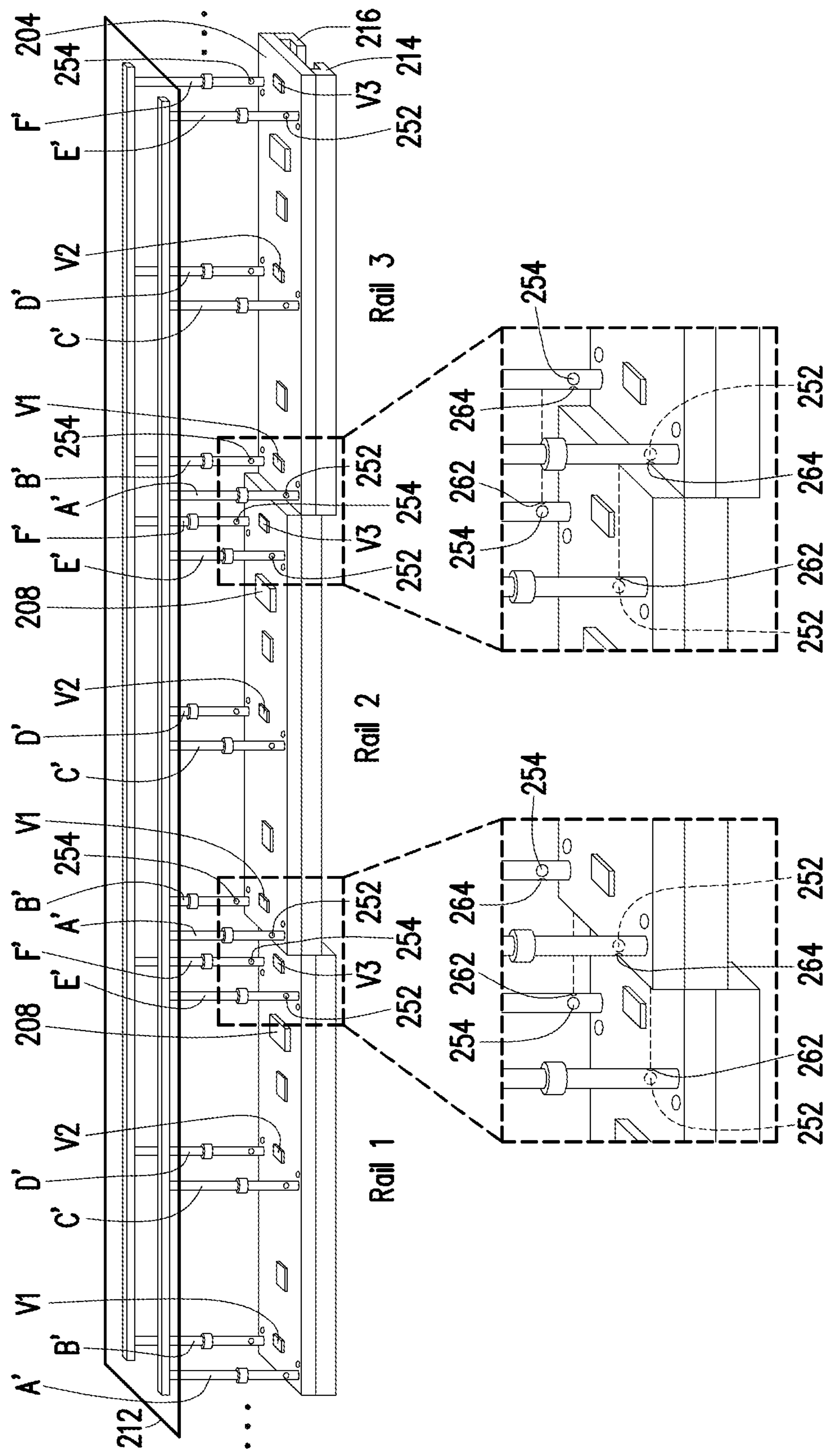
FIG. 9 is a partial schematic view of multiple rail structures that are aligned in serial to form a track for the overhead transport vehicles according to one or more embodiments of the present disclosure.

FIG. 9 is a partial schematic view of multiple rail structures 204 that are aligned in serial to form a track for the overhead transport vehicles 500 according to one or more embodiments of the present disclosure. Features of the rail structure 204 illustrated in FIG. 9 that are the same as features of the rail structures 204 illustrated in FIG. 1 are identified by the same reference numeral.

Referring to FIG. 9, the overhead rail system 200 of the overhead transport system 100 includes multiple rail structures 204 that are hung from the ceiling of the semiconductor plant. In some embodiments, each of the rail structures 204, including three rail structures 204 (Rail 1, Rail 2, and Rail 3) shown in FIG. 9, are configured to be aligned in serial to form the track for the overhead transport vehicles 500.

In some embodiments, each of the rail structures 204 is configured with at least one light emitter (e.g., laser emitter 262) of a supplemental alignment check device 260 or one light sensor (e.g., laser sensor 264) of a supplemental alignment check device 260 to confirm its level with adjacent or neighboring rail structures 204.

As shown in FIG. 9, in the present embodiment, two hangers 206 (E' and F') located near the end of the rail structure 204 (Rail 1) are configured with the laser emitters 262 of the supplemental alignment check device 260. Laser emitters 262 of the supplemental alignment check device 260 included in the hangers 206 (E' and F') are arranged to face the adjacent rail structure 204 (Rail 2) (i.e., facing laser sensors 264 of the supplemental alignment check device 260 included in the hanger 206 (A' and B') of the adjacent rail structure 204 (Rail 2)).

In the present embodiment, each of the laser sensors 264 of the supplemental alignment check device 260 has a laser detection surface configured to measure the location of the laser detected on the laser detection surface. In some embodiments, the supplemental alignment check device 260 is the Internet of Things (IoT) device configured to transmit supplemental alignment measurement data which includes the location detected by the laser detection surface to the controller 400 wirelessly.

In some embodiments, the processor 406 is configured to determine that adjacent rail structures 204 are aligned based on the supplemental alignment measurement data. For example, in some embodiments, the processor 406 determines that the rail structures 204 (e.g., Rail 1 and Rail 2) are not aligned if the supplemental alignment measurement data indicates that at least one of the laser emitted from the laser emitters 262 was not detected by the laser sensors 264. In some embodiments, the processor 406 determines that the rail structures 204 (e.g., Rail 1 and Rail 2) are not aligned if the supplemental alignment measurement data indicates that at least one of the lasers emitted from the laser emitters 262 was detected outside of the center of the laser detection surface by more than a predetermined distance.

Figure 10:
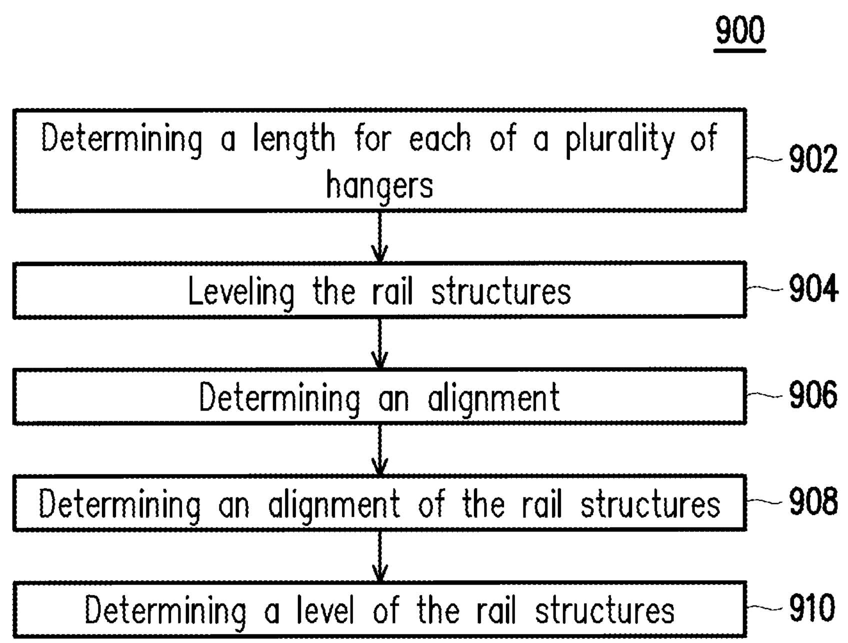
FIG. 10 is a flowchart illustrating a method of a rail structure leveling process for multiple rail structures implemented by the overhead transport system according to one or more embodiments of the present disclosure.

FIG. 10 is a flowchart illustrating a method of a rail structure leveling process for multiple rail structures 900 implemented by the overhead transport system 100 according to one or more embodiments of the present disclosure.

Method 900 includes an operation 902 of determining a length for each of the plurality of hangers 206. In some embodiments, the operation 902 includes collecting the distance between the rail structures 204 (including the rail structure 204 from which the abnormal vibration was detected and neighboring rail structures 204) and the raceways 202 at different locations on a real time basis. In some embodiments, each of the rangefinders 240 is located on the top surface of the rail structure 204 or embedded into the surface of the rail structure 204 to measure each length of the hangers 206. In the present embodiment, each of the rangefinders 240 (A, B, C, D, E, and F) is arranged on the rail structures 204 (Rail 1, Rail 2, and Rail 3) to measure and transmit the length of the hangers 206 (A', B', C', D', E', and F') that support the rail structures 204 (Rail 1, Rail 2, and Rail 3) on a real time basis to the controller 400. In some embodiments, upon receiving the distance measurement data (i.e., length for each of the hangers 206) from the rangefinders 240, the processor 406 is configured to check the lengths as described in the operation 710 above.

Method 900 includes an operation 904 of leveling the rail structures 204. In some embodiments, the operation 904 includes adjusting the hangers 206 based on the distance measurement data collected during the operation 802. In some embodiments, the processor 406 is configured to transmit the adjustment signal to the link member driver 222. In response to the adjustment signal, the link member driver 222 adjusts the length of the hangers 206 with an abnormal length (e.g., length that is short or longer than the predetermined length) to the predetermined or desired length. As discussed above, the link member driver 222 is configured to control the suitable expansion mechanism (e.g., step motor, inner hollow member 224, and outer hollow member 226) that is capable of adjusting the length of the hanger 206 to the predetermined or desired length. In some embodiments, the operations 902 and 904 are looped until all of the hangers 206, which support the rail structures 204 (Rail 1, Rail 2, and Rail 3), have the predetermined or desired length.

Method 900 includes an operation 906 of determining the alignment of the hangers 206. In some embodiments, the operation 906 includes confirming the alignment of the hangers 206 that support the rail structure 204 (from which the abnormal vibration was detected) and the adjacent rail structures 204.

As discussed above, in the present embodiment, each of first hangers (e.g., A', C', and E') includes the laser emitter 252 and each of second hangers (e.g., B', D', and F') that faces the first hangers (e.g., A', C', and E'), respectively, includes the laser sensor 254. In the present disclosure, the laser sensor 254 included in the second hanger 206 (B') is configured to detect the laser emitted from the laser emitter 252 included in the first hanger 206 (A') and the laser sensor 254 included in the second hanger 206 (D') is configured to detect the laser emitted from the laser emitter 252 included in the first hanger 206 (C'). Likewise, the laser sensor 254 included in the second hanger 206 (F') is configured to detect the laser emitted from the laser emitter 252 included in the first hanger 206 (E'). As discussed above, each of the laser sensors 254 transmits the alignment measurement data to the controller 400. Based on the alignment measurement data, the processor 406 confirms or determines whether all of the hangers 206 are aligned. In some embodiments, the operations 902, 904, and 906 are looped until the processor 406 determines that all of the hangers 206 are aligned with each other.

Method 900 includes an operation 908 of determining the alignment of the rail structures 204. In some embodiments, the operation 908 includes confirming the alignment of the rail structure 204 (from which the abnormal vibration was detected) with the adjacent rail structures 204.

As discussed above, in the present embodiment, the supplemental alignment check device 260, which is configured to transmit the supplemental alignment measurement data, is implemented to confirm the alignment of the rail structure 204 (from which the abnormal vibration was detected) with the adjacent rail structures 204. Based on the supplemental alignment measurement data, the processor 406 confirms or determines whether all of the rail structures 204 are aligned in serial. In some embodiments, the operations 902, 904, 906, and 908 are looped until the processor 406 determines that all of the rail structures 204 are aligned in serial.

In some embodiments, method 900 includes an operation 910 of determining the level of the rail structures 204. For example, the operation 910 includes confirming the level of the rail structures 204 using the level measurement data. In some embodiments, the operations 902, 904, 906, 908, and 910 are looped until the processor 406 determines that the rail structures 204 are leveled with the proper slope.

The present disclosure provides, in various embodiments, apparatuses and methods that may be utilized to automatically reduce or absorb the abnormal vibration that will produce a substantial fabrication cost savings by reducing defect wafers due to the abnormal vibration. Additionally, the apparatuses and methods described by the present disclosure will produce improved and more consistent maintenance of the overhead rail by automatically determining the source of the abnormal vibration based on the monitoring measurement data collected from the sensors in a real time basis. This will significantly reduce the time required to locate the source of the undesired vibration or shock.

According to one or more embodiments of the present disclosure, a method of leveling an overhead rail structure for transporting a wafer cassette includes determining a length for each of a plurality of hangers configured to support the overhead rail structure. The method also includes leveling the rail structure by adjusting the length of the hangers and determining an alignment of at least one pair of the hangers.

According to one or more embodiments of the present disclosure, a method of determining a source of abnormal vibration from an overhead transport system, including an overhead rail and an overhead vehicle transporting a wafer cassette on the overhead rail, includes measuring vibration from the overhead rail at different locations. The method also includes determining a location of the overhead rail from which the abnormal vibration was measured and damping the abnormal vibration.

According to one or more embodiments of the present disclosure, the overhead transport system includes a processor, an overhead rail, a plurality of hangers that support the overhead rail, a vibration meter configured to measure vibration from the overhead rail, and a damper included in each of the hanger. The processor is configured to change a property of the damper in response to a determination that the measured vibration by the vibration meter is indicative of an abnormal vibration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of leveling an overhead rail structure for transporting a wafer cassette, comprising:
- determining a length for each of a plurality of hangers configured to support the overhead rail structure;
- leveling the rail structure by adjusting the length of the hangers; and
- determining an alignment of at least one pair of the hangers with a laser transmitter along a first hanger of the pair of hangers and a laser sensor along a second hanger of the pair of hangers, wherein the first hanger and the second hanger are facing each other.

2. The method according to claim 1, further comprising:
- measuring vibration from the overhead rail at different locations.

3. The method according to claim 2, wherein the vibration is measured by a plurality of vibration meters, and each respective vibration meter of the plurality of vibration meters is located at a corresponding location of the different locations along the overhead rail structure.

4. The method according to claim 3, wherein the vibration meter is an Internet of Things (IoT) device configured to transmit the vibration measurement to a controller.

5. The method according to claim 1, wherein the determining the length of at least one of the hangers includes:
- measuring, by a rangefinder, a distance between the rail structure and a raceway.

6. The method according to claim 1, wherein the leveling the rail structure includes:
- adjusting the length of the hangers to different adjusted lengths.

7. The method according to claim 1, further comprising:
- measuring, by a level meter located on the rail structure, a level of the rail structure.

8. The method according to claim 7, wherein the level meter is an Internet of Things (IoT) device configured to transmit the level measurement to a controller.

9. A method of determining a source of abnormal vibration from an overhead transport system, including an overhead rail and an overhead vehicle transporting a wafer cassette on the overhead rail, comprising:
- measuring vibration from the overhead rail at different locations;
- determining a location of the overhead rail from which the abnormal vibration was measured; and
- damping the abnormal vibration.

10. The method according to claim 9, further comprising:
- determining a level of the overhead rail from which the abnormal vibration was measured.

11. The method according to claim 9, further comprising: determining a length for each of a plurality of hangers configured to support the overhead rail from which the abnormal vibration was measured.

12. The method according to claim 9, further comprising: determining an alignment of at least one pair of hangers.

13. The method according to claim 9, further comprising: determining the source of the abnormal vibration based on a measurement database.

14. The method according to claim 13, wherein the measurement database includes at least one of vibration measurement data, level measurement data, alignment measurement data, and hanger length measurement data.

15. The method according to claim 13, further comprising:

in response to a determination that the overhead transport vehicle is the source of the abnormal vibration, transmitting, by a controller, an overhead transport vehicle control signal to move the overhead transport vehicle that caused the abnormal vibration to a maintenance area.

16. The method according to claim 13, further comprising:

in response to a determination that the overhead rail at the location the abnormal vibration was measured is the source of the abnormal vibration, transmitting, by a controller, an overhead transport vehicle control signal with alternative routes to avoid traveling on a portion of the overhead rail at the location.

17. An overhead rail system, comprising:

a processor;

an overhead rail;

a plurality of hangers that support the overhead rail;

a vibration meter configured to measure vibration from the overhead rail; and a damper included in each of the hangers, wherein the processor is configured to change a property of the damper in response to a determination that the measured vibration by the vibration meter is indicative of an abnormal vibration.

18. The overhead rail system of claim 17, further comprising: a level meter on the overhead rail, wherein the level meter is configured to measure a slope of the overhead rail.

19. The overhead rail system of claim 17, further comprising: a rangefinder on the overhead rail, wherein the rangefinder is configured to measure a length of at least one of the hangers.

20. The overhead rail system of claim 17, further comprising: an alignment check device including a laser transmitter on a first hanger of the plurality of hangers and a laser sensor on a second hanger of the plurality of hangers, wherein the first hanger and the second hanger are facing each other.

* * * * *